(12) United States Patent
Kang

(10) Patent No.: US 8,896,340 B2
(45) Date of Patent: Nov. 25, 2014

(54) SEMICONDUCTOR MODULES

(75) Inventor: Tae Jin Kang, Yongin-si (KR)

(73) Assignee: SK Hynix Inc., Gyeonggi-do (KR)

( * ) Notice: Subject to any disclaimer, the term of this patent is extended or adjusted under 35 U.S.C. 154(b) by 239 days.

(21) Appl. No.: 13/615,373

(22) Filed: Sep. 13, 2012

(65) Prior Publication Data
US 2013/0257474 A1 Oct. 3, 2013

(30) Foreign Application Priority Data
Mar. 30, 2012 (KR) .................. 10-2012-0033486

(51) Int. Cl.
*H03K 19/003* (2006.01)
(52) U.S. Cl.
USPC ............... 326/30; 365/198; 365/227
(58) Field of Classification Search
None
See application file for complete search history.

(56) References Cited

U.S. PATENT DOCUMENTS

2007/0040574 A1* 2/2007 Janzen et al. .................. 326/30
2010/0208534 A1 8/2010 Fujisawa

FOREIGN PATENT DOCUMENTS

KR 100541045 B1 12/2005

* cited by examiner

*Primary Examiner* — Jany Richardson
(74) *Attorney, Agent, or Firm* — William Park & Associates Patent Ltd.

(57) ABSTRACT

Semiconductor modules are provided. The semiconductor module includes semiconductor chips with one or more ranks. The semiconductor module includes a mode register configured for storing a first information signal whose logic level is set or determined according to a number of the ranks and an on-die termination (ODT) controller configured for generating an internal control signal for activating an ODT circuit in response to the first information signal. The internal control signal is enabled during a read operation or disabled during a write operation.

18 Claims, 2 Drawing Sheets

SEMICONDUCTOR MODULES

CROSS-REFERENCES TO RELATED APPLICATIONS

The present application claims priority under 35 U.S.C. 119(a) to Korean Application No. 10-2012-0033486, filed on Mar. 30, 2012, in the Korean Intellectual Property Office, which is incorporated herein by reference in its entirety.

BACKGROUND

1. Technical Field

Embodiments of the present disclosure generally relate to integrated circuit devices and to semiconductor modules.

2. Related Art

In general, a semiconductor module may be designed with two or more independent sets of semiconductor chips connected to the same address and data buses, and each set is called a rank. Thus, the semiconductor module may be categorized as either a single rank module or an "N" rank module (wherein, "N" denotes a natural number which is equal to or greater than two) according to the number of the ranks. That is, all the semiconductor chips in the single rank semiconductor module may be concurrently accessed at any given time while the semiconductor chips in the "N" rank semiconductor module may be divided into "N" groups which are independently accessed during different time periods from each other.

Within semiconductor systems, it is generally necessary to match the impedance of a transmission line (e.g., a transmission channel) with the corresponding termination impedance (e.g., a termination resistor) in order to prevent undesirable signal reflections. Such signal reflections act as noises on the signal line in relation to signals subsequently transmitted on the transmission line. The termination resistors of the conventional semiconductor modules or systems have been disposed outside semiconductor chips constituting the semiconductor modules or systems. However, in the event that the termination resistors are disposed outside high performance semiconductor chips such as double data rate 2 (DDR2) synchronous dynamic random access memory (SDRAM) chips, there may be some limitations in preventing the undesirable signal reflections.

Recently, the termination resistors have been disposed inside the high performance semiconductor chips to prevent the undesirable signal reflections. That is, on-die termination (ODT) circuits have been widely used in the semiconductor modules and/or the semiconductor systems. In general, the ODT circuit may be enabled when an ODT signal having a high logic level is applied to an ODT pad of the semiconductor chip, and the ODT circuit may be disabled when an ODT signal having a low logic level is applied to the ODT pad of the semiconductor chip.

When the semiconductor chips include the ODT circuits, ODT signals may be required to operate the ODT circuits included in the semiconductor chips and the semiconductor module should be configured to include input pins for receiving the ODT signals. If the number of the input pins of the semiconductor module increases, manufacturing costs of a semiconductor package including the semiconductor module may also increase. Accordingly, technologies for internally activating the ODT circuits without use of the input pins have been continuously proposed and required.

BRIEF SUMMARY

Various embodiments are directed to semiconductor modules.

According to various embodiments, a semiconductor module includes semiconductor chips with one or more ranks. The semiconductor module includes a mode register configured for storing a first information signal whose logic level is set or determined according to a number of the ranks and an on-die termination (ODT) controller configured for generating an internal control signal for activating an ODT circuit in response to the first information signal. The internal control signal is enabled during a read operation or disabled during a write operation.

According to various embodiments, a semiconductor module includes semiconductor chips with one or more ranks. The semiconductor module includes a mode register configured for extracting a first information signal and a second information signal from an internal address signal to store the first and second information signals therein, a control signal receiver configured for receiving an external control signal through an ODT pad in response to the second information signal, and an on-die termination (ODT) controller generating an internal control signal in response to the first and second information signals and receiving the internal control signal or the external control signal as an input signal to generate an ODT enable signal for activating an ODT circuit.

BRIEF DESCRIPTION OF THE DRAWINGS

Embodiments of the inventive concept will become more apparent in view of the attached drawings and accompanying detailed description, in which.

DETAILED DESCRIPTION

Various embodiments of the inventive concept are described hereinafter with reference to the accompanying drawings. However, the various embodiments described herein are for illustrative purposes only and are not intended to limit the scope of the inventive concept.

Figure 1:
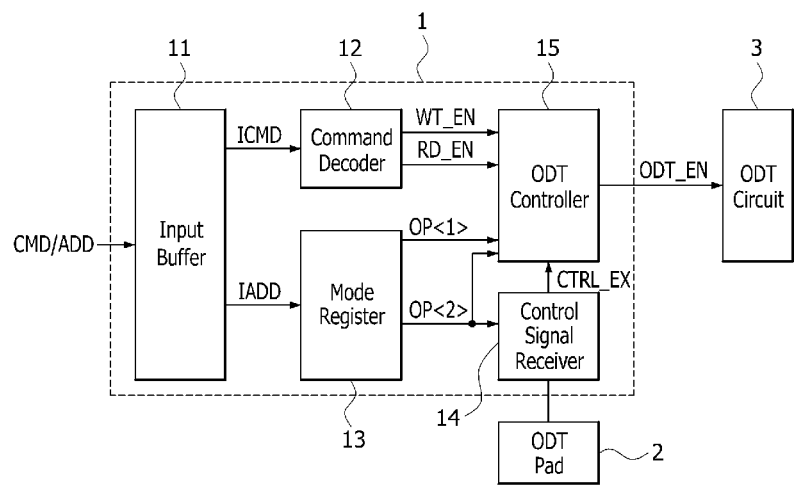
FIG. 1 is a block diagram illustrating a configuration of a semiconductor module according to an embodiment.

FIG. 1 is a block diagram illustrating a configuration of a semiconductor module according to an embodiment.

As illustrated in FIG. 1, a semiconductor module according to an embodiment may be configured to include a control signal generation circuit 1, an ODT pad 2, and an ODT circuit 3. The control signal generation circuit 1 may include an input buffer 11, a command decoder 12, a mode register 13, a control signal receiver 14, and an ODT controller 15.

The input buffer 11 may receive and buffer a command/address signal CMD/ADD to generate an internal command signal ICMD and an internal address signal IADD. The mode register 13 may generate a first information signal OP<1> and a second information signal OP<2> in response to the internal address signal IADD. A logic level of the first information signal OP<1> may be set or determined according to the number of ranks of the semiconductor module. Here, the rank means a group of semiconductor chips which are simultaneously accessed at a given time. For example, the first information signal OP<1> may have a logic "low" state in a single rank semiconductor module, and the first information signal OP<1> may have a logic "high" state in an "N" rank semiconductor module (wherein, "N" denotes a natural number which is equal to or greater than two). Further, a logic level of the second information signal OP<2> may be determined according to whether the control signal generation circuit 1 receives an external control signal CTRL_EX through the ODT pad 2. For example, the second information signal OP<2> may have a logic "high" state when the control signal generation circuit 1 receives the external control signal CTRL_EX through the ODT pad 2, and the second information signal OP<2> may have a logic "low" state when the control signal generation circuit 1 does not receive the external control signal CTRL_EX through the ODT pad 2.

The command decoder 12 may decode the internal command signal ICMD to generate a write enable signal WT_EN and a read enable signal RD_EN. The write enable signal WT_EN may be enabled to have a logic "high" state during a write operation, and the read enable signal RD_EN may be enabled to have a logic "high" state during a read operation.

The mode register 13 may extract the first and second information signals OP<1> and OP<2> included in the internal address signal IADD and may store the first and second information signals OP<1> and OP<2> therein. The first and second information signals OP<1> and OP<2> stored in the mode register 13 may be transmitted to the ODT controller 15.

The control signal receiver 14 may receive the external control signal CTRL_EX through the ODT pad 2 or not in response to the second information signal OP<2>. For example, the control signal receiver 14 may receive and output the external control signal CTRL_EX through the ODT pad 2 when the second information signal OP<2> has a logic "high" state, and the control signal receiver 14 may not receive the external control signal CTRL_EX through the ODT pad 2 when the second information signal OP<2> has a logic "low" state.

The ODT controller 15 may receive the write enable signal WT_EN, the read enable signal RD_EN and the external control signal CTRL_EX as input signals and may generate an ODT enable signal ODT_EN for activating the ODT circuit 3 in response to the first and second information signals OP<1> and OP<2>.

Configurations and operations of the ODT controller 15 will be described hereinafter with reference to FIG. 2.

Figure 2:
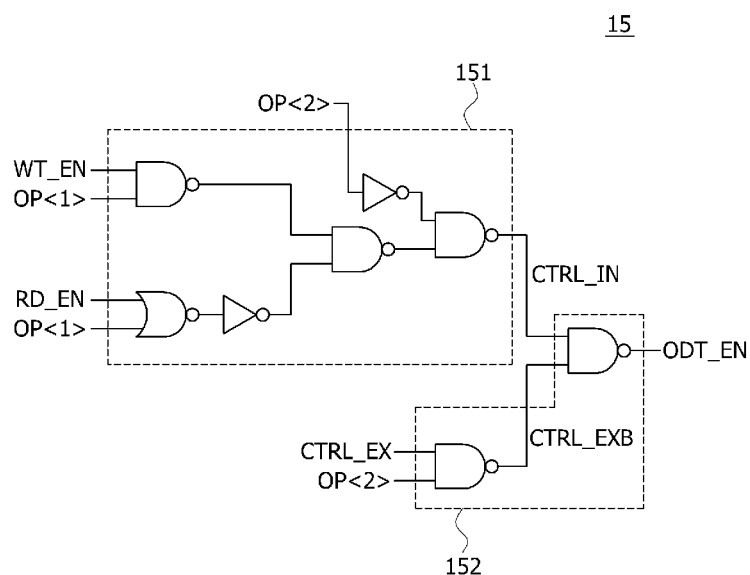
FIG. 2 is a circuit diagram illustrating an example of an on-die termination (ODT) controller included in a control signal generation circuit illustrated in FIG. 1.

As illustrated in FIG. 2, the ODT controller 15 may be configured to include an internal control signal generator 151 and a selection transmitter 152.

The internal control signal generator 151 may receive the write enable signal WT_EN and the read enable signal RD_EN as input signals and may generate an internal control signal CTRL_IN in response to the first and second information signals OP<1> and OP<2>, respectively. Specifically, when the first information signal OP<1> has a logic "high" state and the second information signal OP<2> has a logic "low" state, the internal control signal generator 151 may generate an internal control signal CTRL_IN disabled to have a logic "low" state only during a write operation (e.g., only when the write enable signal WT_EN has a logic "high" state). Alternatively, when both the first and second information signals OP<1> and OP<2> have a logic "low" state, the internal control signal generator 151 may generate an internal control signal CTRL_IN enabled to have a logic "high" state only during a read operation (e.g., only when the read enable signal RD_EN has a logic "high" state).

The selection transmitter 152 may buffer the internal control signal CTRL_IN or the external control signal CTRL_EX and may generate an ODT enable signal ODT_EN in response to the second information signal OP<2> (or i.e., in response to a CTRL_EXB signal). Also, when the second information signal OP<2> has a logic "high" state, the selection transmitter 152 may buffer the external control signal CTRL_EX enabled to have a logic "high" state to generate an ODT enable signal ODT_EN enabled to have a logic "high" state in response to the internal control signal CTRL_IN enabled to have a logic "high" state. Also, when the second information signal OP<2> has a logic "low" state, the selection transmitter 152 may buffer the internal control signal CTRL_IN disabled to have a logic "low" state to generate an ODT enable signal ODT_EN enabled to have a logic "high" state even though the external control signal CTRL_EX is disabled to have a logic "low" state.

Figure 3:
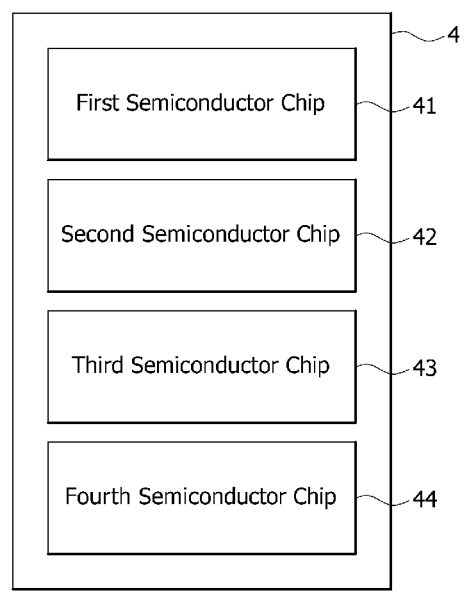
FIG. 3 is a block diagram for describing a rank of a semiconductor module.

FIG. 3 is a block diagram for describing a rank of a semiconductor module.

As illustrated in FIG. 3, when a semiconductor module 4 including first to fourth semiconductor chips 41, 42, 43, and 44, respectively, is a single rank module, write operations or read operations of the first to fourth semiconductor chips 41, 42, 43, and 44, respectively, may substantially be simultaneously executed. Alternatively, when the semiconductor module 4 is a dual rank module, the first to fourth semiconductor chips 41, 42, 43, and 44, respectively, may be divided into two groups and the semiconductor chip(s) included in each group may substantially be simultaneously operated to execute their write operations or their read operations. For example, when the first and second semiconductor chips 41 and 42, respectively, belong to a first group of the dual rank module and the third and fourth semiconductor chips 43 and 44, respectively, belong to a second group of the dual rank module, write operations or read operations of the first and second semiconductor chips 41 and 42, respectively, may substantially be simultaneously executed and write operations or read operations of the third and fourth semiconductor chips 43 and 44, respectively, may also substantially be simultaneously executed. Similarly, when the semiconductor module 4 is an "N" rank module, the first to fourth semiconductor chips 41, 42, 43, and 44, respectively, may be divided into "N" groups and the semiconductor chip(s) included in each group may substantially be simultaneously operated to execute their write operations or their read operations.

The operations of the single rank module and the "N" rank module will be described hereinafter with reference to FIGS. 1 and 2.

First, the operations of the single rank module will be described.

When the external control signal CTRL_EX is inputted through the ODT pad 2, the second information signal OP<2> may have a logic "high" state. Thus, the external control signal CTRL_EX may be buffered to generate the ODT enable signal ODT_EN.

Alternatively, when the external control signal CTRL_EX is not inputted through the ODT pad 2, the second information signal OP<2> may have a logic "low" state. In such a case, the first information signal OP<1> may be set to have a logic "low" state in a single rank module. Thus, the internal control signal CTRL_IN may be enabled to have a logic "high" state only during a read operation (e.g., when the read enable signal RD_EN is enabled to have a logic "high" state). Accordingly, the ODT enable signal ODT_EN may be disabled to have a logic "low" state only during the read operation.

Next, the operations of the "N" rank module will be described.

When the external control signal CTRL_EX is inputted through the ODT pad 2, the second information signal OP<2> may have a logic "high" state. Thus, the external control signal CTRL_EX may be buffered to generate the ODT enable signal ODT_EN.

Alternatively, when the external control signal CTRL_EX is not inputted through the ODT pad 2, the second information signal OP<2> may have a logic "low" state. In such a case, the first information signal OP<1> may be set to have a logic "high" state in an "N" rank module. Thus, the internal control signal CTRL_IN may be disabled to have a logic "low" state only during a write operation (e.g., when the write enable signal WT_EN is enabled to have a logic "high" state). Accordingly, the ODT enable signal ODT_EN may be enabled to have a logic "high state only during the write operation.

As described above, semiconductor modules according to the embodiments may generate an internal control signal CTRL_IN to output an ODT enable signal ODT_EN for controlling activation of an ODT circuit even without receipt of an external control signal CTRL_EX inputted through an ODT pad. Thus, because the semiconductor modules can be realized without input pins for receiving external control signal CTRL_EX, manufacturing costs of packages including the semiconductor modules may be reduced.

Further, the ODT circuit may be activated by diverse manners according to the number of ranks. That is, the ODT circuit may be controlled to be disabled only during a read operation in a single rank module, and the ODT circuit may be controlled to be enabled only during a write operation in an "N" rank module (wherein, "N" denotes a natural number which is equal to or greater than two).

The various embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A semiconductor module including semiconductor chips with one or more ranks, the semiconductor module comprising:
    a mode register configured for storing a first information signal whose logic level is set or determined according to a number of the ranks; and
    an on-die termination (ODT) controller configured for receiving a write enable signal and a read enable signal to generate an internal control signal for activating an ODT circuit in response to the first information signal,
    wherein the internal control signal is enabled during a read operation or disabled during a write operation, and
    wherein the write enable signal is enabled during a write operation and the read enable signal is enabled during a read operation.

2. The semiconductor module of claim 1:
    wherein the first information signal is set to have a first logic level when all the semiconductor chips substantially simultaneously operate in a single rank mode;
    wherein the first information signal is set to have a second logic level when the semiconductor chips are divided into N groups to operate in an N rank mode; and
    wherein N denotes a natural number which is equal to or greater than two.

3. The semiconductor module of claim 2, wherein the internal control signal is enabled during the read operation when the first information signal has the first logic level.

4. The semiconductor module of claim 3, wherein the internal control signal is disabled during the write operation when the first information signal has the second logic level.

5. The semiconductor module of claim 1, wherein the mode register further stores a second information signal including information on whether the ODT controller receives an external control signal for activating the ODT circuit.

6. The semiconductor module of claim 5, further comprising a control signal receiver that receives the external control signal in response to the second information signal,
    wherein the ODT controller receives the external control signal through the control signal receiver.

7. The semiconductor module of claim 5, wherein the ODT controller includes:
    an internal control signal generator configured for receiving a write enable signal and a read enable signal as input signals and generating the internal control signal in response to the first and second information signals.

8. The semiconductor module of claim 7, wherein the ODT controller includes:
    a selection transmitter configured for receiving the internal control signal or the external control signal as an input signal and generating an ODT enable signal for activating the ODT circuit in response to the second information signal.

9. The semiconductor module of claim 8:
    wherein the selection transmitter buffers the internal control signal to generate the ODT enable signal which is enabled when the second information signal has a first logic level; and
    wherein the selection transmitter buffers the external control signal to generate the ODT enable signal which is enabled when the second information signal has a second logic level different from the first logic level.

10. A semiconductor module including semiconductor chips with one or more ranks, the semiconductor module comprising:
    a mode register configured for extracting a first information signal and a second information signal from an internal address signal to store the first and second information signals therein;
    a control signal receiver configured for receiving an external control signal through an ODT pad in response to the second information signal; and
    an on-die termination (ODT) controller generating an internal control signal in response to the first and second information signals and receiving the internal control signal or the external control signal as an input signal to generate an ODT enable signal for activating an ODT circuit.

11. The semiconductor module of claim 10, wherein a logic level of the first information signal is determined according to a number of the ranks.

12. The semiconductor module of claim 11:
    wherein the first information signal is set to have a first logic level when all the semiconductor chips substantially simultaneously operate in a single rank mode;
    wherein the first information signal is set to have a second logic level when the semiconductor chips are divided into N groups to operate in an N rank mode; and
    wherein N denotes a natural number which is equal to or greater than two.

13. The semiconductor module of claim 12, wherein the internal control signal is enabled during the read operation when the first information signal has the first logic level.

14. The semiconductor module of claim 13, wherein the internal control signal is disabled during the write operation when the first information signal has the second logic level.

15. The semiconductor module of claim 10, wherein the ODT controller includes:
    an internal control signal generator configured for receiving a write enable signal and a read enable signal as input signals and generating the internal control signal in response to the first and second information signals.

16. The semiconductor module of claim 15, wherein the ODT controller includes:
   a selection transmitter receiving the internal control signal or the external control signal as an input signal and generating the ODT enable signal in response to the second information signal.

17. The semiconductor module of claim 16, wherein the write enable signal is enabled during a write operation and the read enable signal is enabled during a read operation.

18. The semiconductor module of claim 16:
   wherein the selection transmitter buffers the internal control signal to generate the ODT enable signal which is enabled when the second information signal has a first logic level; and
   wherein the selection transmitter buffers the external control signal to generate the ODT enable signal which is enabled when the second information signal has a second logic level different from the first logic level.

* * * * *